United States Patent
Wells et al.

(10) Patent No.: US 8,866,627 B2
(45) Date of Patent: *Oct. 21, 2014

(54) METHOD AND APPARATUS OF IDENTIFYING OR LOCATING CURRENT SENSORS

(75) Inventors: Christopher D. Wells, McMurray, PA (US); Praveen Sutrave, Sewickley, PA (US)

(73) Assignee: Eaton Corporation, Cleveland, OH (US)

( * ) Notice: Subject to any disclaimer, the term of this patent is extended or adjusted under 35 U.S.C. 154(b) by 206 days.

This patent is subject to a terminal disclaimer.

(21) Appl. No.: 13/553,891

(22) Filed: Jul. 20, 2012

(65) Prior Publication Data

US 2014/0022082 A1    Jan. 23, 2014

(51) Int. Cl.
    *G08B 21/00*    (2006.01)
(52) U.S. Cl.
    USPC .......................................... 340/635
(58) Field of Classification Search
    USPC ................. 340/635, 815.45, 596, 657, 691.1; 439/490
    See application file for complete search history.

(56) References Cited

U.S. PATENT DOCUMENTS

| 5,696,695 | A | 12/1997 | Ehlers et al. |
| 5,995,855 | A | 11/1999 | Kiani et al. |
| 6,577,243 | B1 | 6/2003 | Dannenmann et al. |
| 7,049,937 | B1 * | 5/2006 | Zweig et al. ................... 340/657 |
| 8,128,428 | B2 * | 3/2012 | Caveney et al. .............. 439/490 |
| 8,588,050 | B2 * | 11/2013 | Caveney et al. .............. 370/200 |
| 2006/0057876 | A1 | 3/2006 | Dannenmann et al. |
| 2011/0098952 | A1 * | 4/2011 | Long et al. ..................... 702/61 |
| 2012/0101760 | A1 | 4/2012 | Sutrave et al. |
| 2012/0101765 | A1 | 4/2012 | McComas et al. |

FOREIGN PATENT DOCUMENTS

| DE | 10 2007 039 294 A1 | 4/2009 |
| EP | 2 448 071 A1 | 5/2012 |
| FR | 2 942 322 A1 | 8/2010 |
| WO | 2007/025223 A1 | 3/2007 |
| WO | 2009/158202 A1 | 12/2009 |
| WO | 2012/079151 A1 | 6/2012 |

OTHER PUBLICATIONS

European Patent Office, "International Search Report and Written Opinion", Jul. 26, 2013, 11 pp.

* cited by examiner

*Primary Examiner* — Phung Nguyen
(74) *Attorney, Agent, or Firm* — Eckert Seamans Cherin & Mellott, LLC; Kirk D. Houser

(57) ABSTRACT

An energy monitoring system for a power conductor includes a base unit, a sensor cable, and a current sensor. The base unit includes a first indicator circuit and a first resistance electrically connected to a voltage source. The sensor cable includes a conductor. The current sensor is electrically connected to the base unit by the sensor cable. The current sensor includes a second resistance and a second indicator. The first resistance and the first indicator circuit are electrically connected to the second resistance and the second indicator by the conductor.

20 Claims, 3 Drawing Sheets

METHOD AND APPARATUS OF IDENTIFYING OR LOCATING CURRENT SENSORS

CROSS-REFERENCE TO RELATED APPLICATION

This application is related to commonly assigned, copending U.S. patent application Ser. No. 13/553,893, filed Jul. 20, 2012, entitled "METHOD AND APPARATUS OF LOCATING CURRENT SENSORS".

BACKGROUND

1. Field

The disclosed concept pertains generally to monitoring systems and, more particularly, to energy monitoring systems with a current sensor for sensing current flowing in an electrical conductor. The disclosed concept further pertains to methods of identifying and/or locating a current sensor.

2. Background Information

Energy monitoring systems can monitor energy passing through one or more electrical conductors. A typical energy monitoring system includes one or more current sensors (e.g., without limitation, current transformers) electrically connected to a base unit.

Current sensors of various types are generally known. For example, a current transformer typically includes an annular iron core about which a plurality of turns of a number of windings are wrapped. In use, an electrical conductor is situated in the hole of the annular iron core, and when an alternating current is passed through the conductor, the conductor serves as a single turn primary winding to induce a current in the secondary winding. Depending upon the application, the secondary winding is electrically connected with a burden resistor of a base unit. The base unit senses a voltage across the burden resistor and responsively provides an output which may be, for instance, a measurement of the current. While current sensors and energy monitoring systems have been generally effective for their intended purposes, they have not been without limitation.

In an environment in which a plurality of current sensors are electrically connected to the base unit, it has been difficult to determine the identities and locations of the current sensors. For example, when a cable electrically connecting a base unit and a current transformer is relatively long, or otherwise difficult to trace, it is difficult to locate the current sensor that is electrically connected with the base unit. Moreover, it takes time for a technician to visually locate a current sensor to determine the identity of the current sensor.

It thus would be desirable to provide an improved energy monitoring system that overcomes these and other shortcomings associated with the relevant art.

SUMMARY

These needs and others are met by embodiments of the disclosed concept in which an energy monitoring system includes a base unit including a base unit electrically connected to a current sensor, wherein the base unit includes a first indicator circuit and a first resistance and the current sensor electrically connected by a sensor cable, and wherein the first resistance and the first indicator circuit are electrically connected to the second resistance and the second indicator.

In accordance with one aspect of the disclosed concept, an energy monitoring system for a power conductor comprises: a base unit including a first indicator circuit and a first resistance electrically connected to a voltage source; a sensor cable including a conductor; a current sensor electrically connected to the base unit by the sensor cable, said current sensor including a second resistance and a second indicator, wherein the first resistance and the first indicator circuit are electrically connected to the second resistance and the second indicator by the conductor.

In accordance with another aspect of the disclosed concept, a method of multiplexing sensor identification and sensor location information on a common conductor comprises: providing a base unit including a first indicator circuit and a first resistance electrically connected to a voltage source; providing a sensor cable including a conductor; providing a current sensor including a second resistance and a second indicator; and electrically connecting the base unit to the current sensor with the sensor cable such that the first resistance and the first indicator circuit are electrically connected to the second resistance and the second indicator by the conductor.

BRIEF DESCRIPTION OF THE DRAWINGS

A full understanding of the disclosed concept can be gained from the following description of the preferred embodiments when read in conjunction with the accompanying drawings in which.

DESCRIPTION OF THE PREFERRED EMBODIMENTS

As employed herein, the term "number" shall mean one or an integer greater than one (i.e., a plurality).

As employed herein, the term "electrical conductor" shall mean a wire (e.g., without limitation, solid; stranded; insulated; non-insulated), a copper conductor, an aluminum conductor, a suitable metal conductor, or other suitable material or object that permits an electric current to flow easily.

As employed herein, the statement that two or more parts are "connected" or "coupled" together shall mean that the parts are joined together either directly or joined through one or more intermediate parts. Further, as employed herein, the statement that two or more parts are "attached" shall mean that the parts are joined together directly.

Figure 1:
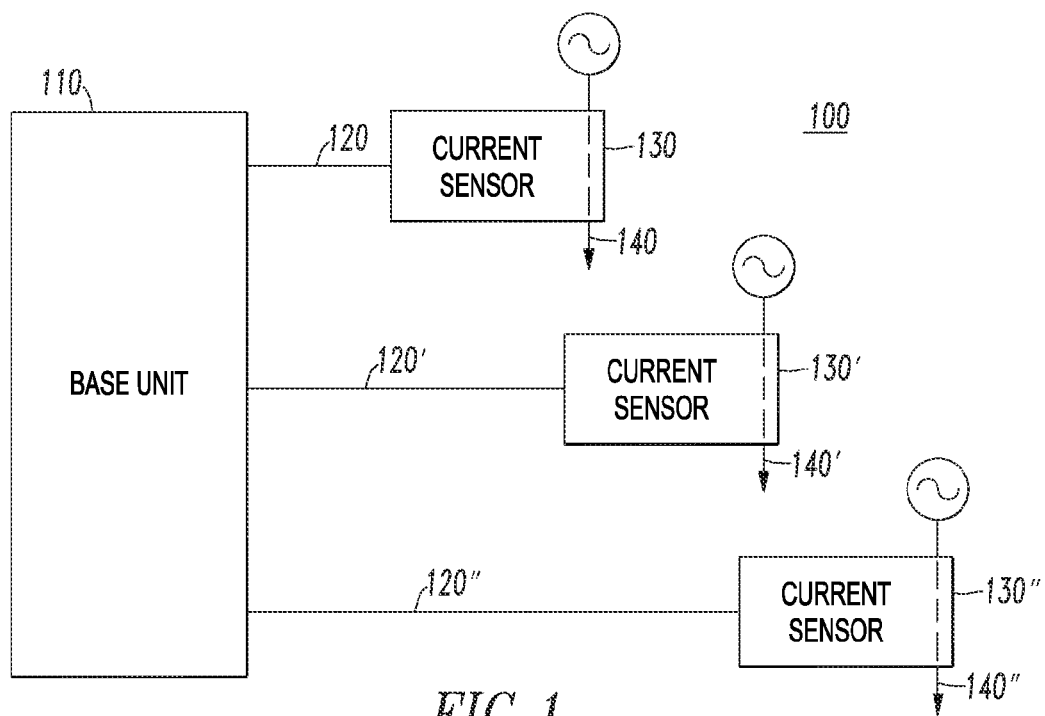
FIG. 1 is a block diagram of an energy monitoring system in accordance with embodiments of the disclosed concept.

Referring to FIG. 1, an energy monitoring system 100 is shown. The energy monitoring system 100 includes a base unit 110 electrically connected to first, second, and third current sensors 130, 130', 130" (e.g., without limitation, current transformers) by first, second, and third sensor cables 120, 120', 120" (e.g., without limitation, twisted pair cables) respectively. Although FIG. 1 illustrates the base unit 110 electrically connected to three current sensors, the disclosed concept is not limited thereto. The base unit 110 can be electrically connected to any number of current sensors. The first, second, and third current sensors 130, 130', 130" are inductively coupled to first, second, and third power conductors 140, 140', 140", respectively. As such, the energy monitoring system 100 can sense the current flowing through each of the first, second, and third power conductors 140, 140', 140".

Figure 2:
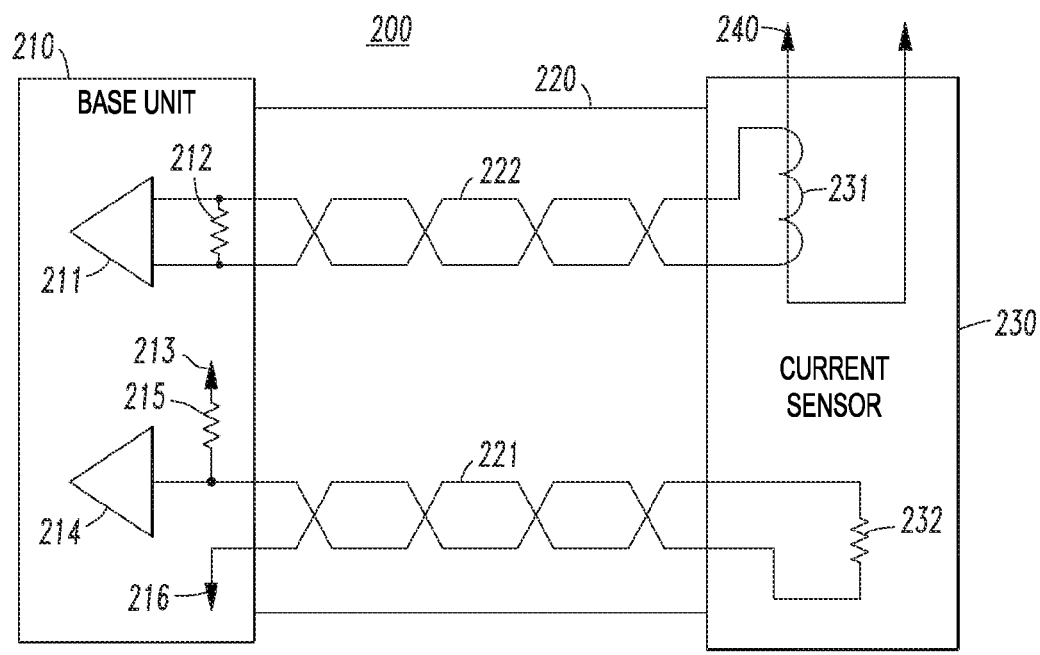
FIG. 2 is a circuit diagram of an energy monitoring system in accordance with other embodiments of the disclosed concept.

FIG. 2 illustrates an energy monitoring system 200 including a base unit 210 and a current sensor 230 electrically connected by a sensor cable 220. The base unit 210 includes a sensed current output 211 (e.g., without limitation, an analog to digital converter), a burden resistance 212, a voltage source 213, a sensor identification output 214 (e.g., without limitation, an analog to digital converter), a first resistance 215, and a ground 216. The ground 216 may also be, for example and without limitation, a common reference point.

The sensor cable 220 includes a first conductor 221 (e.g., without limitation, a twisted pair) and a second conductor 222 (e.g., without limitation, a twisted pair). Although FIG. 2 illustrates the sensor cable 220 including two conductors, the disclosed concept is not limited thereto. The sensor cable 220 can include any suitable count of conductors.

The current sensor 230 includes a secondary winding 231 and a second resistance 232. The secondary winding 231 is inductively coupled to a power conductor 240.

The first resistance 215 and the second resistance 232 are electrically connected by the first conductor 221. The first resistance 215 and the second resistance 232 form a voltage divider circuit which divides the source voltage 213 based on the first resistance 215 and second resistance 232. A voltage between the first resistance 215 and the second resistance 232 is an identification voltage which can be used to identify the current sensor 230.

For example, the value of the second resistance 232 corresponds to an identity of the current sensor 230. Thus, the identification voltage sensed at the base unit 210 corresponds to the value of the second resistance 232 and can be used to identify the current sensor 230 electrically connected to the base unit 210. The base unit 210 may also include a memory (not shown) with a database corresponding identification voltages with identities of current sensors.

The identification voltage can also indicate an error. When the identification voltage is outside of a predetermined range, it can indicate an error, such as, for example, an electrical disconnection between the base unit 210 and the current sensor 230.

Continuing to refer to FIG. 2, the secondary winding 231 is inductively coupled to the power conductor 240 such that a current in the power conductor 240 induces a current in the secondary winding 231. The secondary winding 231 is also electrically connected to the burden resistance 212 by the second conductor 222. As such, the current induced in the secondary winding 231 causes a voltage across the burden resistance 212. The sensed current output 211 senses the current in the power conductor 240 by sensing the voltage across the burden resistance 212.

The sensed current output 211 can be, for example and without limitation, an analog to digital converter which converts the sensed voltage into a digital signal. The digital signal may then be output to, for example and without limitation, a processor (not shown). The sensed current output 211 is not limited to an analog to digital converter, and can also be, for example and without limitation, an analog component.

Figure 3:
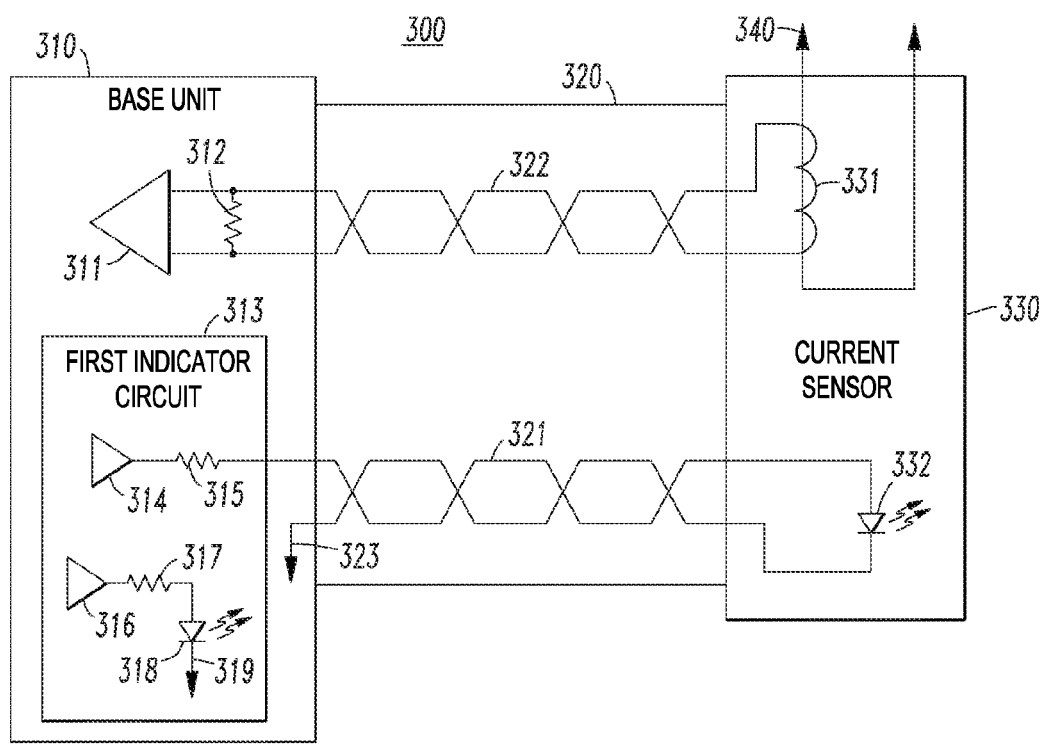
FIG. 3 is a circuit diagram of an energy monitoring system in accordance with other embodiments of the disclosed concept.

Referring to FIG. 3, an energy monitoring system 300 is shown. The energy monitoring system 300 includes a base unit 310 electrically connected to a current sensor 330 by a sensor cable 320.

The base unit 310 includes a sensed current output 311 (e.g., without limitation, an analog to digital converter), a burden resistance 312, a first indicator circuit 313, and a ground 323. The first indicator circuit 313 includes a first indicator output 316, a second indicator output 314, a first load resistance 315, a second load resistance 317, a first indicator 318 (e.g., without limitation, a light emitting diode), and a ground 319. The grounds 319, 323 may also be, for example and without limitation, a common reference point.

The sensor cable 320 includes a first conductor 321 (e.g., without limitation, a twisted pair) and a second conductor 322 (e.g., without limitation, a twisted pair). Although FIG. 3 illustrates the sensor cable 320 including two conductors, the disclosed concept is not limited thereto. The sensor cable 320 can include any number of conductors.

The current sensor 330 includes a secondary winding 331 and a second indicator 332 (e.g., without limitation, a light emitting diode). The secondary winding 331 is inductively coupled to a power conductor 340.

The first indicator circuit 313 is electrically connected to the second indicator 332 by the first conductor 321. The first indicator circuit 313 controls the first indicator 318 and the second indicator 332 to turn on simultaneously. For example, the second indicator output 314 provides an output to the second indicator 332 to cause the second indicator 332 to turn on while the first indicator output 316 simultaneously provides an output to the first indicator 318 to cause the first indicator 318 to turn on. When the first indicator 318 and the second indicator 332 turn on simultaneously, it becomes easier for a technician to determine the location of the current sensor 330 electrically connected with the base unit 310.

Continuing to refer to FIG. 3, the secondary winding 331 is inductively coupled to the power conductor 340 such that a current flowing in the power conductor 340 induces a current in the secondary winding 331. The secondary winding 331 is also electrically connected to the burden resistance 312 by the second conductor 322. As such, the current induced in the secondary winding 331 causes a voltage across the burden resistance 312. The sensed current output 311 senses the current in the power conductor 340 by sensing the voltage across the burden resistance 312.

The sensed current output 311 can be, for example, an analog to digital converter which converts the sensed voltage into a digital signal. The digital signal may then be output to, for example and without limitation, a processor (not shown). The sensed current output 311 is not limited to an analog to digital converter, and can also be, for example and without limitation, an analog component.

Figure 4:
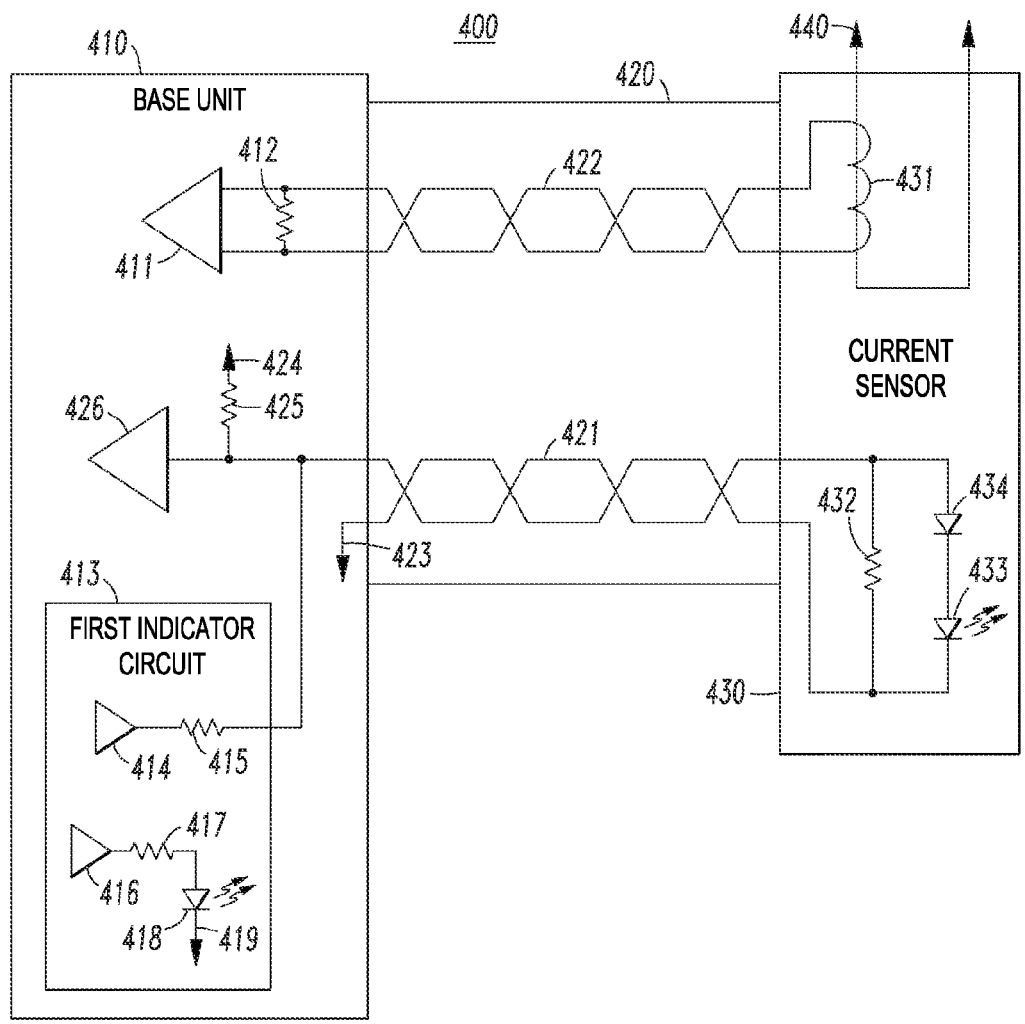
FIG. 4 is a circuit diagram of an energy monitoring system in accordance with other embodiments of the disclosed concept.

FIG. 4 illustrates an energy monitoring system 400 including a base unit 410 and a current sensor 430 electrically connected by a sensor cable 420. The base unit 410 includes a sensed current output 411 (e.g., without limitation, an analog to digital converter), a burden resistance 412, a first indicator circuit 413, a voltage source 424, a sensor identification output 426 (e.g., without limitation, an analog to digital converter), a first resistance 425, and a ground 423. The first indicator circuit 413 includes a first indicator output 416, a second indicator output 414, a first load resistance 415, a second load resistance 417, a first indicator 418 (e.g., without limitation, a light emitting diode), and a ground 419. The grounds 419, 423 may also be, for example and without limitation, a common reference point.

The sensor cable 420 includes a first conductor 421 (e.g., without limitation, a twisted pair) and a second conductor 422 (e.g., without limitation, a twisted pair). Although FIG. 4 illustrates the sensor cable 420 including two conductors, the disclosed concept is not limited thereto. The sensor cable 420 can include any suitable count of conductors.

The current sensor 430 includes a secondary winding 431, a second resistance 432, and a second indicator 433. The secondary winding 431 is inductively coupled to a power conductor 440. The current sensor 430 may also include a diode 434 electrically connected in series with the second indicator 433. The second resistance 432 and the series combination of the second indicator 433 and the optional diode 434 are connected in parallel.

The first indicator circuit 413 is electrically connected to the second indicator 433 by the first conductor 421. The first indicator circuit 413 controls the first indicator 418 and the second indicator 433 to turn on simultaneously. For example, the second indicator output 414 provides an output to the second indicator 433 to cause the second indicator 433 to turn on while the first indicator output 416 simultaneously provides an output to the first indicator 418 to cause the first indicator 418 to turn on. When the first indicator 418 and the second indicator 433 turn on simultaneously, it becomes easier for a technician to determine the location of the current sensor 430 electrically connected with the base unit 410.

The first resistance 425 is electrically connected with the voltage source 424. The first resistance 425 is also electrically connected with the second resistance 432 by the first conductor 421. The first resistance 425 and the second resistance 432 form a voltage divider circuit which divides the source voltage 424 based on the first resistance 425 and second resistance 432. A voltage between the first resistance 425 and the second resistance 432 is an identification voltage which can be used by the base unit 410 to identify the current sensor 430.

Continuing to refer to FIG. 4, the first resistance 425 and the first indicator circuit 413 are both electrically connected to the second resistance 432 and the second indicator 433 by the first conductor 421. To facilitate the sharing of a common conductor 421, the active voltage range for sensor identification is different than the voltage to turn on the second indicator 433. For example, the maximum normal operating voltage of the sensor identification can be less than the voltage needed to turn on the second indicator 433. Thus, when the second indicator output 414 provides an output to turn on the second indicator 433, it does not interfere with the normal sensor identification operation of the base unit 410.

As illustrated in FIG. 4, the diode 434 is electrically connected in series with the light emitting diode 433. The diode 434 may be, without limitation, a Shottky diode or a regular diode. The diode 434 may optionally be used to adjust the voltage needed to turn on the light emitting diode 433. The diode 434 may also be bypassed.

The second indicator output 414 can have a high impedance mode. The high impedance mode can be used to prevent the second indicator output 414 from interfering with the sensor identification while the base unit 410 is identifying the current sensor 430.

While specific embodiments of the disclosed concept have been described in detail, it will be appreciated by those skilled in the art that various modifications and alternatives to those details could be developed in light of the overall teachings of the disclosure. Accordingly, the particular arrangements disclosed are meant to be illustrative only and not limiting as to the scope of the disclosed concept which is to be given the full breadth of the claims appended and any and all equivalents thereof.

What is claimed is:

1. An energy monitoring system for a power conductor, said energy monitoring system comprising:
    a base unit including a first indicator circuit and a first resistance electrically connected to a voltage source;
    a sensor cable including a conductor;
    a current sensor electrically connected to the base unit by the sensor cable, said current sensor including a second resistance and a second indicator, wherein the first resistance and the first indicator circuit are electrically connected to the second resistance and the second indicator by the conductor.

2. The energy monitoring system of claim 1, wherein the base unit includes a sensor identification output electrically connected between the first resistance and the second resistance and configured to sense the identification voltage and convert the identification voltage to a digital signal.

3. The energy monitoring system of claim 1, wherein the base unit senses an identification voltage between the first resistance and the second resistance to identify the current sensor.

4. The energy monitoring system of claim 3, wherein the first indicator circuit includes a first indicator and the first indicator circuit controls the first indicator and the second indicator to turn on simultaneously.

5. The energy monitoring system of claim 4, wherein the first indicator circuit includes a first indicator output configured to apply a first voltage to turn on the first indicator and a second indicator output configured to apply a second voltage to turn on the second indicator; and wherein the first indicator output and the second indicator output respectively apply the first voltage and the second voltage simultaneously.

6. The energy monitoring system of claim 4, wherein a maximum of a normal operating range of the identification voltage is less than a voltage to turn on the second indicator.

7. The energy monitoring system of claim 4, wherein when the base unit is identifying the current sensor the first indicator circuit switches to a high impedance state.

8. The energy monitoring system of claim 4, wherein the first indicator and the second indicator are light emitting diodes.

9. The energy monitoring system of claim 1, wherein the conductor is a twisted pair.

10. The energy monitoring system of claim 1, wherein the voltage source, the first resistance, and the second resistance form a voltage divider circuit.

11. The energy monitoring system of claim 1, wherein the current sensor includes a diode electrically connected in series with the second indicator.

12. The energy monitoring system of claim 1, wherein the second resistance is electrically connected in parallel with the second indicator.

13. The energy monitoring system of claim 1, wherein the current sensor includes a secondary winding inductively coupled to the power conductor; wherein the conductor is a first conductor; and wherein the sensor cable includes a second conductor configured to electrically connect the secondary winding to the base unit.

14. The energy monitoring system of claim 1, wherein the current sensor is structured to inductively couple to a power conductor to sense current flowing through the power conductor.

15. A method of multiplexing sensor identification and sensor location information on a common conductor, the method comprising:
    providing a base unit including a first indicator circuit and a first resistance electrically connected to a voltage source;
    providing a sensor cable including a conductor;
    providing a current sensor including a second resistance and a second indicator; and
    electrically connecting the base unit to the current sensor with the sensor cable such that the first resistance and the first indicator circuit are electrically connected to the second resistance and the second indicator by the conductor.

16. The method of claim 15, further comprising:
sensing an identification voltage between the first resistance and the second resistance to identify the current sensor.

17. The method of claim 16, further comprising:
employing a first indicator in the first indicator circuit; and
controlling the first indicator and the second indicator to turn on simultaneously.

18. The method of claim 16, further comprising:
employing a maximum of a normal operating range of the identification voltage that is less than a voltage to turn on the second indicator.

19. The method of claim 16, further comprising:
switching the first indicator circuit to a high impedance state when the current sensor is being identified.

20. The method of claim 15, wherein the current sensor is structured to inductively couple to a power conductor to sense current flowing through the power conductor.

* * * * *